United States Patent
Farnsworth et al.

(10) Patent No.: US 6,307,747 B1
(45) Date of Patent: Oct. 23, 2001

(54) RESILIENT PROCESSOR/HEAT SINK RETAINING ASSEMBLY

(75) Inventors: Arthur K. Farnsworth, Houston; Francis A. Felcman, Rosenberg; Donald J. Hall, Houston, all of TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/349,908

(22) Filed: Jul. 8, 1999

(51) Int. Cl.[7] ....................................................... H05K 7/20
(52) U.S. Cl. ......................... 361/704; 165/80.3; 165/185; 174/16.3; 257/719; 361/710; 361/719
(58) Field of Search ................................. 165/80.2, 80.3, 165/185; 174/16.3; 361/704, 707, 709–710, 715–719, 720, 722; 257/706–707, 712–713, 718–719, 726–727; 248/505, 510; 24/295–296, 457–458, 573, 625

(56) References Cited

U.S. PATENT DOCUMENTS

| | | | |
|---|---|---|---|
| 5,287,249 | 2/1994 | Chen | 361/718 |
| 5,477,916 | 12/1995 | Lin | 165/80.3 |
| 5,493,475 | 2/1996 | Lin | 361/710 |
| 5,621,244 | 4/1997 | Lin | 257/713 |
| 5,856,910 * | 1/1999 | Yurchenco et al. | 361/704 |
| 5,982,622 * | 11/1999 | Chiou | 361/704 |
| 6,008,990 * | 12/1999 | Liu | 361/704 |
| 6,046,905 * | 4/2000 | Nelson et al. | 361/704 |
| 6,101,091 * | 8/2000 | Baik | 361/704 |
| 6,141,220 * | 10/2000 | Lin | 361/704 |

* cited by examiner

Primary Examiner—Gregory Thompson

(57) ABSTRACT

In a computer processor module/heat sink assembly, a spring clip member is used to resiliently hold a heat-generating die portion of the processor against the heat sink. Spaced retaining pins are secured to the processor module and extend through holes in the heat sink, with outer end portions of the retaining pins being captively retained in slots in the spring clip member, and portions of the clip member adjacent the outer pin ends being resiliently deformed toward the outer side of the heat sink to thereby resiliently press the processor die portion against the underside of the heat sink. The clip member may be quickly installed on and removed from the outer pin ends without the use of tools of any sort. In an alternate embodiment of the processor module/heat sink assembly, the retaining pins are secured to the heat sink and extend through holes in the processor module, with outer ends of the pins being captively and removably secured to the spring clip which is positioned on the outer side of the processor module.

21 Claims, 5 Drawing Sheets

RESILIENT PROCESSOR/HEAT SINK RETAINING ASSEMBLY

BACKGROUND OF THE INVENTION

1. Field of the Invention

The present invention generally relates to electronic apparatus and, in a preferred embodiment thereof, more particularly relates to apparatus for dissipating operating heat from electronic components such as computer processors.

2. Description of Related Art

As personal computers continue to be provided with greater operating power and higher clock speeds, it becomes more critical to provide for adequate operating heat dissipation from various of their high operating heat-generating components such as their processors. A common technique for dissipating processor heat is to forcibly place a finned metal heat sink structure in thermal contact with the die portion of the processor, to receive operating heat therefrom, and then create a forced flow of cooling air across the heat sink structure to remove received processor operating heat therefrom.

As conventionally carried out, the placement of the heat sink against the processor die typically requires the use of a tool. For example, a screwdriver is needed when the heat sink is threadingly connected to a support structure upon which the processor is mounted. Alternatively, specially designed barbed plastic pins have been used to hold the heat sink in forcible contact with the processor die. This securement technique requires the use of a special tool to force the plastic pins into aligned openings in the heat sink and the underlying processor support structure.

This currently required use of tools to operatively connect a heat sink to its associated computer processor is oftentimes a tedious, inconvenient task, and undesirably adds to the overall time and cost of fabricating a personal computer. Moreover, if the heat sink-to-processor connection operation is not carefully carried out, uneven and/or excessive contact forces may be imposed on the processor die by the overlying heat sink structure. If this occurs, the die may be damaged or the necessary operating heat transfer from the processor die to the heat sink may be undesirably lessened.

As can readily be seen from the foregoing, a need exists for improved apparatus for operatively connecting a heat sink structure to a heat generating electronic component such as a computer processor. It is to this need that the present invention is directed.

SUMMARY OF THE INVENTION

In carrying out principles of the present invention, in accordance with a preferred embodiment thereof, specially designed electronic apparatus is provided which is representatively a computer processor module/heat sink assembly. The electronic apparatus representatively comprises a heat sink structure, a support structure, and a heat-generating electronic component, representatively a computer processor, carried on the support structure.

According to a key aspect of the invention, a clamping structure is provided and is operative, without the use of a tool of any sort, to draw the heat sink structure and the support structure toward one another, in a clamping direction, in a manner (1) resiliently pressing the electronic component against the heat sink structure and (2) releasably interconnecting the heat sink structure and the support structure.

The clamping apparatus includes a spaced plurality of projections defined on one of the heat sink and support structures and extending outwardly therefrom in the clamping direction, and a clamping member releasably engageable with the projections and movable along the other one of the heat sink and support structures, in a direction transverse to the clamping direction, to responsively draw the heat sink and support structures toward one another in the clamping direction.

In a preferred embodiment of the clamping apparatus, the spaced plurality of projections are retaining pins secured to one of the heat sink and support structures and extending outwardly through holes in the other of the heat sink and support structures, with outer ends of the retaining pins projecting outwardly beyond the other of the heat sink and support structures. The spring clip member has a plurality of slots disposed therein and configured to slidably receive and captively retain the outer end portions of the retaining pins. Outwardly offset sections of the spring clip member, through which the slots extend, are inwardly deformed by the outer pin ends to maintain the resilient clamping force between the heat-generating electronic component and the heat sink.

The spring clip member is operatively installable on the outer pin ends by inserting the outer pin ends into laterally enlarged end portions of the spring clip slots, and then sliding the spring clip member transversely to the clamping direction to releasably lock the spring clip member in place on the assembly. To remove the spring clip member, and permit the heat sink and support structures to be separated from one another, the spring clip member is simply slid in an opposite direction transverse to the clamping direction, to position the outer pin ends at the laterally enlarged slot ends and permit the removal of the outer pin ends from the spring clip member slots.

BRIEF DESCRIPTION THE DRAWINGS

DETAILED DESCRIPTION

Figure 1:
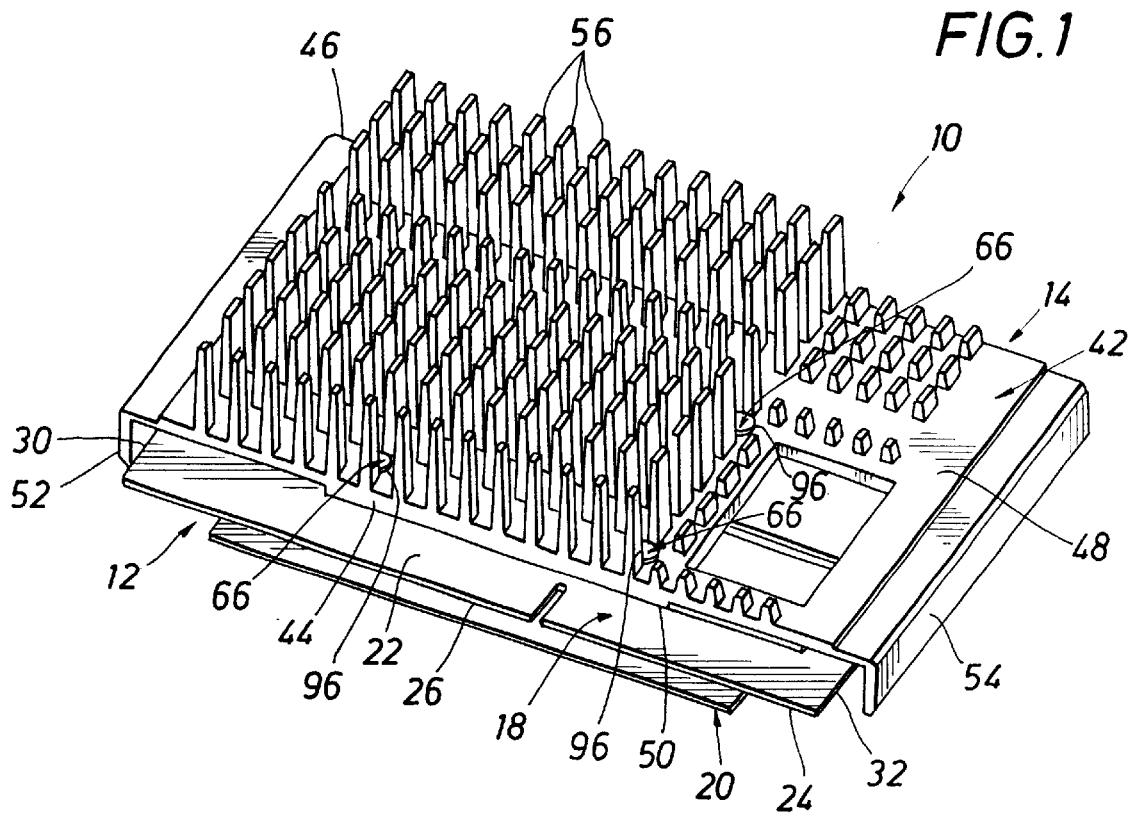
FIG. 1 is a front top side perspective view of a computer processor module/heat sink assembly embodying principles of the present invention.
Figure 2:
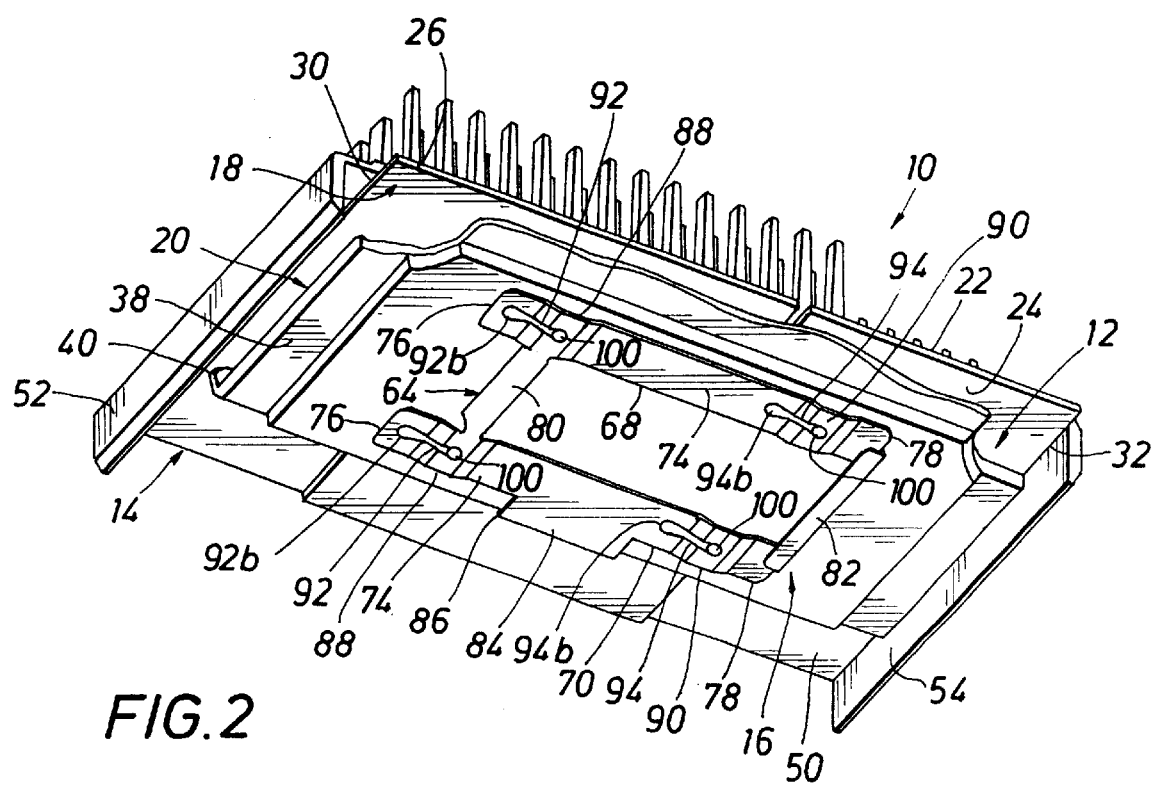
FIG. 2 is a front bottom side perspective view of the processor module/heat sink assembly.
Figure 3:
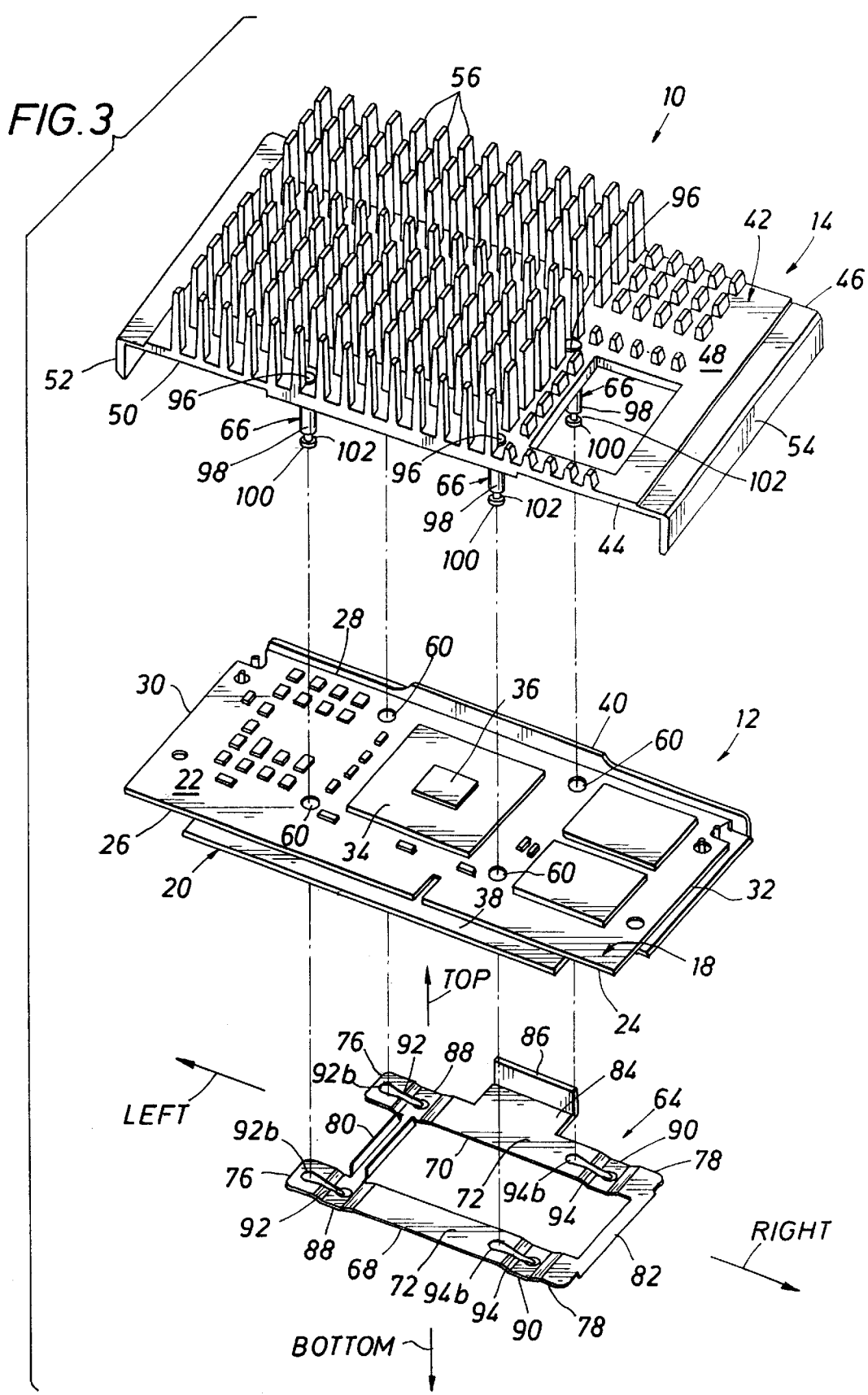
FIG. 3 is an exploded top side perspective view of the processor module/heat sink assembly.

Perspectively illustrated in FIGS. 1–3 is a specially designed computer processor module/heat sink assembly 10 which embodies principles of the present invention and includes a processor module 12, a finned metal heat sink structure 14 and unique clamping apparatus 16 useable without tools of any sort to operatively secure the heat sink 14 to the processor module 12 to receive operating heat therefrom.

The processor module 12 includes an elongated rectangular printed circuit board 18, and a plastic cover structure 20. Printed circuit board 18 has top and bottom sides 22 and 24, front and rear side edges 26 and 28, and left and right end edges 30 and 32. Centrally mounted on the top side 22 of the printed circuit board 18 (see FIG. 3) is a computer processor chip 34 having a thin, rectangular configuration and a smaller, rectangularly configured heat-generating die portion 36 centrally disposed on its top side.

Plastic cover structure 20 has a generally plate-shaped rectangular body portion 38 which underlies and is secured to the underside of the printed circuit board 18. Extending along the rear side edge of the body portion 38 is an upturned flange 40 that extends upwardly past the rear side edge 28 of the printed circuit board 18.

Figure 4:
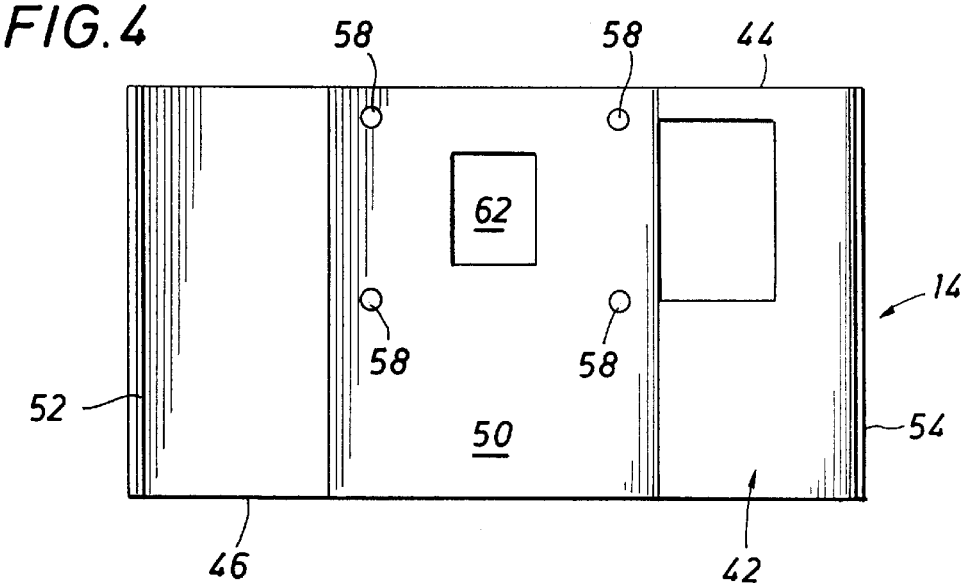
FIG. 4 is a bottom side plan view of the heat sink portion of the assembly.
Figure 5:
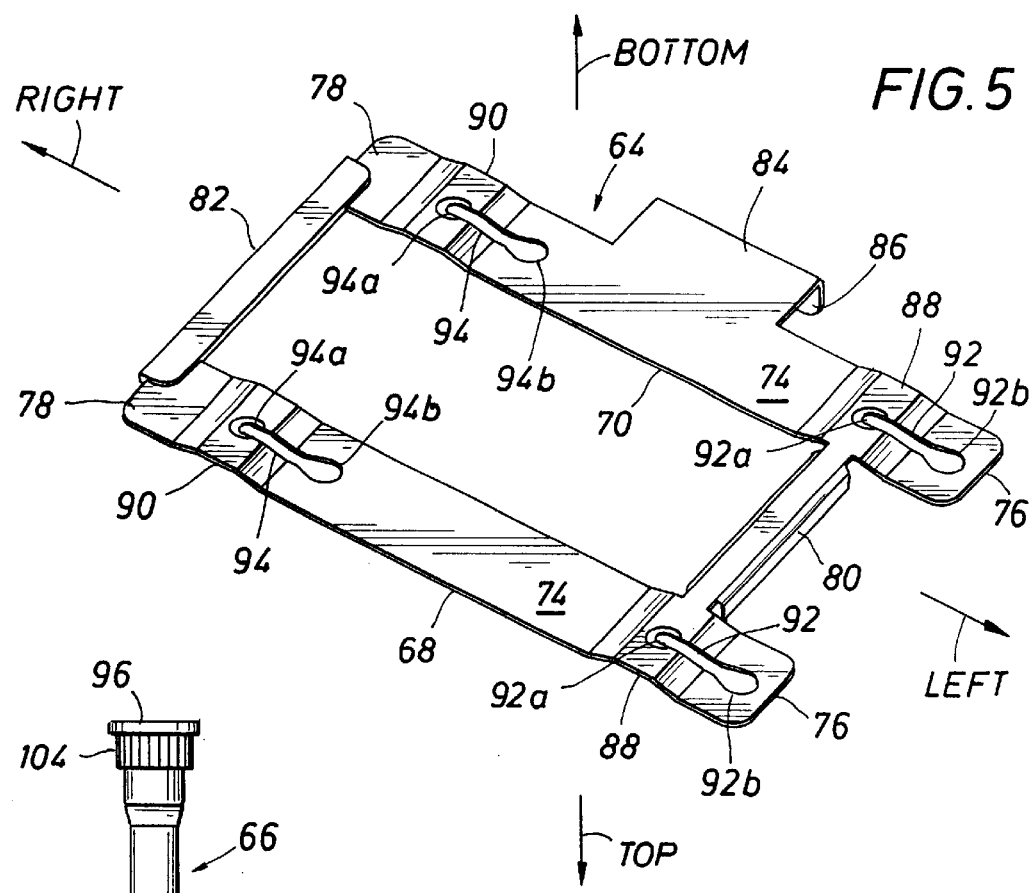
FIG. 5 is an enlarged scale bottom side perspective view of a resilient retaining clip portion of the assembly.

Referring additionally now to FIG. 4, the heat sink 14 has an elongated rectangular plate-shaped body 42 with front and rear side edges 44 and 46, top and bottom sides 48 and 50, and downturned left and right end flanges 52 and 54. A spaced series of cooling fins 56, through which air may be flowed to carry away heat received by the heat sink 14, project upwardly from the top side of the heat sink body 42. As best illustrated in FIG. 4, four circular mounting holes 58 extend through the heat sink body 42, the holes 58 being arranged at the corners of a rectangular pattern centered between the heat sink end flanges 52,54 and offset toward the front side edge 44 of the heat sink body 42. Holes 58 are alignable with holes 60 positioned outwardly adjacent the four corners of the processor 34 and extending downwardly through the circuit board 18 and the underlying cover structure body portion 38 (see FIG. 3). A conventional resilient thermal interface pad 62 is secured to the bottom side 50 of the heat sink body 42 in a central position among the four holes 60.

Turning now to FIGS. 2, 3, 5 and 6, the clamping apparatus 16 includes a resilient sheet metal spring clip member 64 and four associated retaining pins 66. The spring clip member 64 has spaced apart, parallel front and rear elongated arm portions 68 and 70 that longitudinally extend in left-to-right directions. Each of the arm portions 68,70 has top and bottom sides 72,74 and left and right ends 76,78. The left ends 76 are joined by a cross portion 80, and the right ends 78 are joined by a cross portion 82. Extending rearwardly from a longitudinally intermediate portion of the rear side edge of the arm 70 is a rectangular flange 84 having an upturned outer end portion 86.

Each of the left end portions 76 of the arms 68,70 has a longitudinally inset, downwardly offset section 88, and each of the right end portions 78 of the arms 68,70 has a longitudinally inset, downwardly offset section 90. A slot 92 is formed in each of the left end portions 76 of the arms 68,70 and has a right end portion 92*a* disposed in the downwardly offset arm section 88, and a laterally enlarged left end portion 92*b* positioned leftwardly of the downwardly offset arm section 88. Similarly, a slot 94 is formed in each of the right end portions 78 of the arms 68,70 and has a right end portion 94*a* disposed in the downwardly offset arm section 90, and a laterally enlarged left end portion 94*b* positioned leftwardly of the downwardly offset arm section 90.

Figure 6:
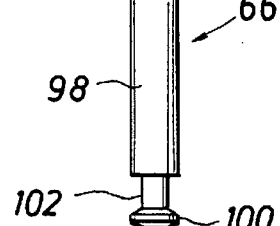
FIG. 6 is an enlarged scale side elevational view of one of four retaining pin portions of the assembly.

Referring now to FIG. 6, each of the four retainer pins 66 has a generally cylindrically cross-sectioned configuration with an upper head portion 96, a reduced diameter longitudinally intermediate body portion 98, and a lower or outer end portion 100 having an annular external groove 102 formed therein. As illustrated, an annular straight knurl section 104 is formed on the head portion 96. The retainer pins 66 are inserted, lower ends 100 first, downwardly through the heat sink mounting holes 58 (see FIG. 4) in a manner such that the knurled pin sections 104 are press-fitted into the side surfaces of the heat sink mounting holes 58, and the lower ends 100 of the retainer pins 66 project downwardly beyond the bottom side 50 of the heat sink body 42 (see FIG. 3).

To operatively couple the heat sink 14 with the processor die 36, in thermal communication therewith, the portions of the retaining pins projecting downwardly from the bottom side 50 of the heat sink body portion 42 (see FIG. 3) are extended downwardly through the aligned openings 60 in the printed circuit board 18 and the underlying cover structure body portion 38 until the grooved lower end portions 100 of the retaining pins 66 extend downwardly beyond the bottom side of the cover structure body portion 38. The receipt of the pins 66 in the holes 60 aligns the top side of the processor die 36 with the thermal interface pad 62 (see FIG. 4) on the bottom side of the heat sink body portion 50.

The downwardly projecting retaining pin end portions 100 are then inserted into the laterally enlarged slot portions 92*b*,94*b* in the arms 68,70 of the spring clip member 64, and the clip member 64 is manually pushed leftwardly (see FIG. 3) in a manner causing opposite side edge portions of the arms 68,70 at each of the slots 92,94 to enter the pin grooves 102. As the spring clip member 64 is further pushed leftwardly, the lower pin ends 100 are moved rightwardly along the bottom side surfaces of the downwardly offset clip arm sections 88,90 in a manner downwardly drawing the heat sink body portion 50 toward the top side of the circuit board 18 and pressing the thermal interface pad 62 (see FIG. 4) against the top side of the processor die 36. When the pin ends 100 reach the right ends of the slots 92 and 94, the pin ends 100 are generally centered in the downwardly offset arm sections 88,90 and resiliently deflect them upwardly to thereby maintain a resilient contact force between the thermal interface pad 62 and the processor die 36 and releasably hold the heat sink 14 in operative engagement with the processor module 12 in the completed processor module/heat sink assembly 10 illustrated in FIGS. 1 and 2.

With this rapid and quite simple manual slide-on installation of the spring clip member 64 the heat sink 14 is operatively coupled to the processor module 12 without the necessity of using tools of any sort. Moreover, a resilient clamping force between the thermal interface pad 62 and the processor die 36 is automatically maintained by the installed spring clip member 64. Because of the resiliency of this clamping force, and the even distribution thereof on the die 36 arising due to the general centering of the die 36 relative to the resiliently deflected spring clip arm sections 88 and 90, the possibility of damaging the die 36 due to excessive and/or uneven clamping forces thereon is substantially eliminated.

As can best be seen in FIG. 2, the spring clip flange 86 extends upwardly along the upturned flange portion 40 of the cover structure 20 and, as the spring clip member 64 is being moved in its leftwardly directed installation direction, slides along such flange portion 40, thereby conveniently guiding the clip member along its installation path. When it is desired to subsequently remove the heat sink 14 from the processor module 12, the installed spring clip member 64 may simply be manually moved rightwardly along the bottom side of the cover structure body portion 38 to move the bottom pin ends 100 into the enlarged slot ends 92b,94b of the spring clip arms 68,70. This permits the spring clip 64 to be downwardly removed from the bottom side of the assembly 10, and the heat sink 14 to be upwardly removed from the top side of the processor module 12.

Figure 7:
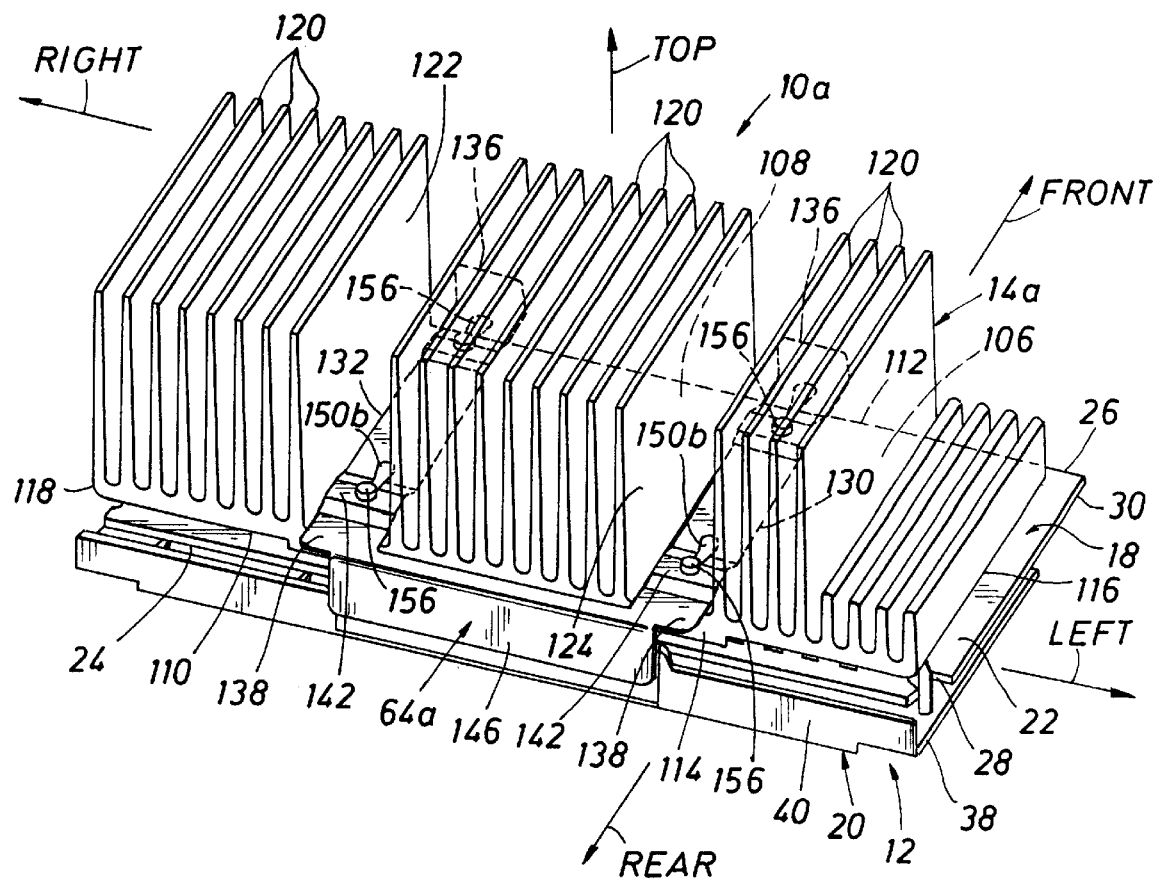
FIG. 7 is a rear top side perspective view of an alternate embodiment of the processor module/heat sink assembly.

A rear top side perspective view of an alternate embodiment 10a of the previously described processor module/heat sink assembly 10 is shown in FIG. 7. The assembly 10a includes the previously described processor module 12 together with a modified finned metal heat sink 14a, a modified spring clip member 64a (see FIG. 8), and four modified retaining pins 66a (see FIG. 11).

Figure 9:
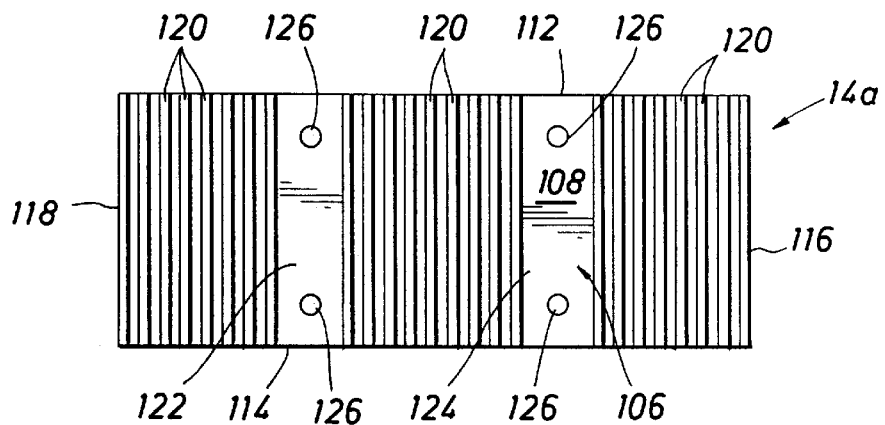
FIG. 9 is a reduced scale top plan view of the heat sink portion of the alternate processor module/heat sink assembly.
Figure 10:
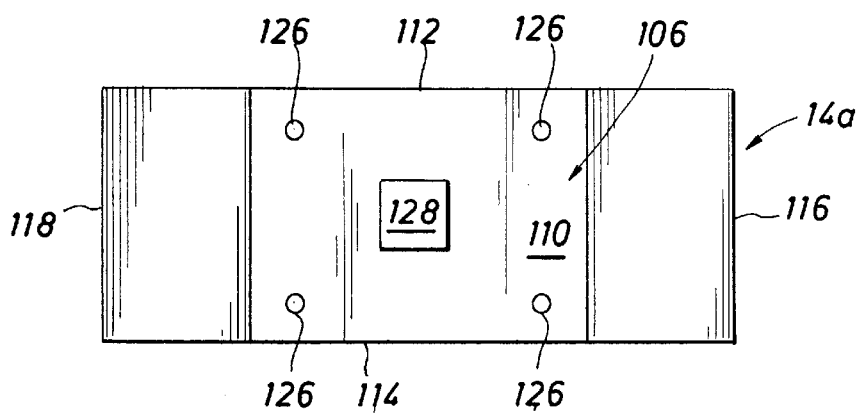
FIG. 10 is a reduced scale bottom plan view of the heat sink portion of the alternate processor module/heat sink assembly.

The heat sink 14a, as illustrated in FIGS. 7, 9 and 10, is positioned on the top side 22 of the printed circuit board 18 and has a generally plate-shaped elongated rectangular body 106 with top and bottom sides 108 and 110, front and rear side edges 112 and 114, and left and right end edges 116 and 118. Spaced series of cooling fins 120 project upwardly from the top side 108 of the heat sink body 106, with spaces 122 and 124 being left between adjacent groups of the fins 120.

As best illustrated in FIGS. 9 and 10, four circular mounting holes 126 extend through the heat sink body 106, and are positioned at the corners of a rectangular area, with two of the holes 126 (see FIG. 9) being disposed in the finless top side space 122, and the other two holes 126 being disposed in the finless top side space 124. A resilient thermal interface pad 128 is secured to the bottom side 110 of the heat sink body 106 in a central location relative to the four mounting holes 126 thereon.

Figure 8:
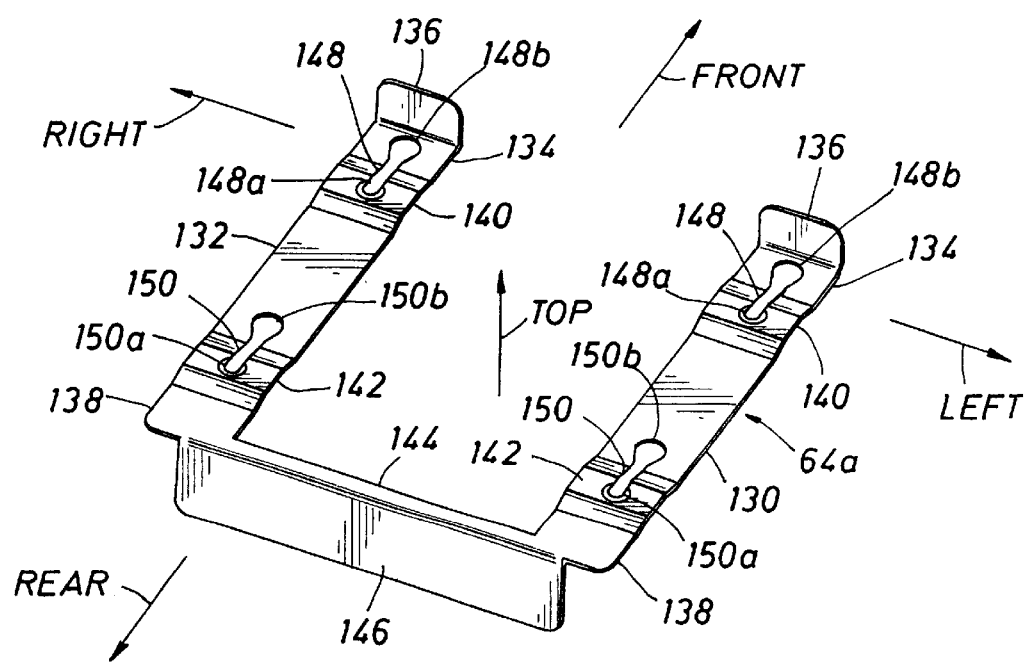
FIG. 8 is an enlarged scale rear top side perspective view of a resilient retaining clip portion of the alternate processor module/heat sink assembly.

Turning now to FIG. 8, the sheet metal resilient spring clip member 64a, as viewed from the front, has left and right elongated arm portions 130 and 132, each of which has a front end portion 134 with an upturned outer end section 136, and a rear end portion 138. Each front end portion 134 has a longitudinally inset, upwardly offset portion 140, and each rear end portion 138 has a longitudinally inset, upwardly offset portion 142. As illustrated, the rear end portions 138 are joined by a cross piece 144 having a downturned flange portion 146.

A slot 148 is formed in each of the front end portions 134 of the arms 130,132 and has a rear end portion 148a disposed in the upwardly offset arm section 140, and a laterally enlarged front end portion 148b positioned forwardly of the upwardly offset arm section 140. Similarly, a slot 150 is formed in each of the rear end portions 138 of the arms 130,132 and has a rear end portion 150a disposed in the upwardly offset arm section 142, and a laterally enlarged front end portion 150b positioned forwardly of the upwardly offset arm section 142.

Figure 11:
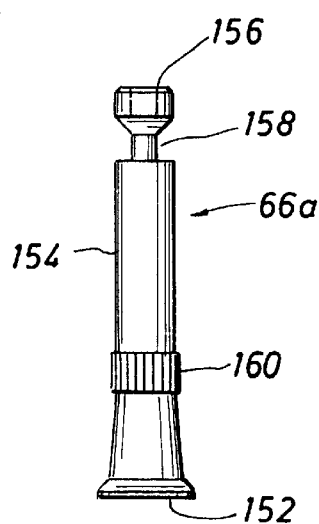
FIG. 11 is an enlarged scale side elevational view of one of four retaining pin portions of the alternate processor module/heat sink assembly.

As illustrated in FIG. 11, each of the four retaining pins 66a has a generally cylindrically cross-sectioned configuration with a lower head portion 152, a reduced diameter body portion 154, and an upper or outer end portion 156 having an annular external groove 158 formed therein. As illustrated, an annular straight knurl section 160 is formed on the body portion axially inwardly of the head 152. The retainer pins 66a are inserted, upper ends 156 first, upwardly through the aligned circuit board and cover structure holes 60 (see FIG. 3) in a manner such that the knurled pin sections 160 are press-fitted into the side surfaces of the holes 60 in the cover structure body portion 38, and the upper ends 156 of the retainer pins 66a project upwardly beyond the top side 22 of the printed circuit board 18.

To operatively couple the heat sink 14a with the processor die 36 (visible in FIG. 3), in thermal communication therewith, the ends 156 of the pins 66a are extended upwardly through the heat sink holes 126 until they project upwardly beyond the top side 108 of the heat sink body 106 (see FIG. 7). This aligns the thermal interface pad 128 (see FIG. 10) with the underlying processor die 36. Next, with the front arm end portions 134 of the spring clip member 64a pointing forwardly, the spring clip arms 132 and 130, respectively, are downwardly inserted into the finless top side areas 122,124 of the heat sink 14a until the upwardly projecting pin ends 156 enter the laterally enlarged slot end portions 148b,150b of the spring clip arms 130,132.

The spring clip member 64a is then manually pushed forwardly (by, for example, pushing on the rear spring clip flange 46) in a manner causing opposite side edge portions of the arms 130,132 at each of the arm slots 148,150 to enter the pin grooves 158. AS the spring clip member 64a is further pushed forwardly, the upper pin ends 156 are moved rearwardly along the upper side surfaces of the upwardly offset clip arm portions 140,142 in a manner upwardly drawing the processor module 12 toward the bottom side 110 of the heat sink 14a and pressing the top side of the processor die 36 upwardly against the thermal interface pad 128. When the upper pin ends 156 reach the rear ends of the arm slots 148 and 150, the rear spring clip flange 146 abuts the rear cover structure flange 40, and the pin ends 156 are generally centered in the upwardly offset arm sections 140,142 and resiliently deflect them downwardly to thereby maintain a resilient contact force between the thermal interface pad 128 and the processor die 36 and releasably hold the heat sink 14a in operative engagement with the processor module 12 in the completed processor module/heat sink assembly 10a illustrated in FIG. 7.

AS in the case of the previously described spring clip member 64 and its associated retaining pins 66, the spring clip member 64a and its associated retaining pins 66a cooperatively function to operatively couple the processor module 12 to its associated heat sink 14a without the necessity of using tools of any sort. Moreover, a resilient clamping force between the thermal interface pad 128 and the processor die 36 is automatically maintained by the installed spring clip member 64a. Because of the resiliency of this clamping force, and the even distribution thereof on the die 36 arising due to the general centering of the die 36 relative to the resiliently deflected spring clip arm sections 140 and 142, the possibility of damaging the die 36 due to excessive and/or uneven clamping forces thereon is substantially eliminated.

When it is desired to subsequently remove the heat sink 14a from the processor module 12, the installed spring clip member 64a may simply be manually moved rearwardly along the top side of the heat sink 14a (by, for example, rearwardly pushing on the upturned front ends 136 of the spring clip arms 130 and 132), to move the upper retaining pin ends 156 into the enlarged slot ends 148b,150b of the spring clip arms 130,132. This permits the spring clip 64a to be upwardly removed from the top side of the heat sink 14a, and the heat sink 14a to be upwardly removed from the top side of the processor module 12.

While the clamping apparatus of the present invention, which illustratively includes the described spring clip members and their associated retaining pins, has been representatively shown as being utilized to resiliently clamp a heat sink against the die portion of a computer processor chip, it will be readily appreciated by those of skill in this particular art that principles of this invention could be alternatively utilized to operatively clamp a heat sink structure against other types of heat-generating electronic components if desired.

The foregoing detailed description is to be clearly understood as being given by way of illustration and example only, the spirit and scope of the present invention being limited solely by the appended claims.

What is claimed is:

1. Electronic apparatus comprising:
   a heat sink structure;
   a support structure;
   a heat-generating electronic component carried on said support structure; and
   clamping apparatus operative, without the use of a tool, to draw said heat sink structure and said support structure toward one another, in a clamping direction, in a manner resiliently pressing said electronic component against said heat sink structure and releasably interconnecting said heat sink structure and said support structure, said clamping apparatus including:
      a spaced plurality of projections defined by retaining members individually said support structure and extending outwardly therefrom in said clamping direction, and
      a clamping member releasably engageable with said projections and movable along said heat sink structure, in a direction transverse to said clamping direction, to responsively draw said heat sink structure and said support structure toward one another in said clamping direction.

2. The electronic apparatus of claim 1 wherein:
   said heat-generating electronic component is a computer processor.

3. The electronic apparatus of claim 1 wherein:
   said support structure includes a circuit board, and
   said heat-generating electronic component is mounted on a side of said circuit board.

4. The electronic apparatus of claim 1 wherein:
   said clamping member is a resiliently deformable spring clip member.

5. The electronic apparatus of claim 4 wherein:
   said spaced plurality of projections having outer end portions,
   said heat sink structure has a spaced series of holes through which said outer end portions of said retaining members pass to project outwardly beyond said heat sink structure, and
   said spring clip member has a plurality of slots disposed therein and configured to slidably receive and captively retain said outer end portions of said retaining members.

6. The electronic apparatus of claim 5 wherein:
   said spring clip member has plate-like portions with laterally offset sections through which said slots extend.

7. The electronic apparatus of claim 6 wherein:
   each of said slots has a first end portion, and a second end portion having a width greater than the width of said first end portion.

8. The electronic apparatus of claim 6 wherein:
   said outer end portions of said retaining members have grooves therein, and
   said plurality of slots have opposing edge portions configured to be slidably received in said grooves.

9. The electronic apparatus of claim 1 wherein:
   said support structure includes a circuit board having a first side and a second side, and a cover structure having a plate-like body portion extending along and secured to said second side of said circuit board, and
   said heat-generating electronic component is a computer processor operatively mounted on said first side of said circuit board.

10. Electronic apparatus comprising:
    a heat sink structure having opposite first and second sides;
    a support structure having a first side facing said first side of said heat sink structure, and an opposite second side;
    a heat-generating electronic component carried on said first side of said support structure;
    a spaced plurality of projections defined by retaining members individually said support structure, said projections having outer end portions projecting outwardly beyond said second side of said heat sink structure; and
    a clamping member carried by said heat sink structure, removably secured to said outer end portions of said projections, and exerting a resilient outward force on said outer end portions of said projections, in a clamping direction, to thereby resiliently hold said electronic component against said first side of said heat sink structure.

11. The electronic apparatus of claim 10 wherein:
    said heat-generating electronic component is a computer processor.

12. The electronic apparatus of claim 10 wherein:
    said support structure includes a circuit board, and
    said heat-generating electronic component is mounted on a side of said circuit board.

13. The electronic apparatus of claim 10 wherein:
    said electronic apparatus is a computer processor module/heat sink assembly.

14. The electronic apparatus of claim 10 wherein:
    said clamping member is operatively securable to said outer end portions of said projections by engaging said clamping member with said outer end portions of said projections, and then moving said clamping member along said heat sink structure in a second direction transverse to said clamping direction.

15. The electronic apparatus of claim 10 wherein:
    said clamping member is removable from said outer end portions of said projections, to thereby permit said heat sink structure and said support structure to be separated from one another, by moving said clamping member along said heat sink structure in a second direction transverse to said clamping direction, and then moving said clamping member away from said heat sink structure in said clamping direction.

16. The electronic: apparatus of claim 10 wherein:
    said clamping member is a resiliently deformable spring clip member.

17. The electronic apparatus of claim 16 wherein:

said electronic apparatus further comprises a spaced plurality of holes extending through said heat sink structure between said opposite first and second sides thereof, said projections are movably extended through said holes, with said outer end portions of said projections extending outwardly beyond said second side of said heat sink structure, and said clamping member is positioned on said second side of said heat sink structure.

18. The electronic apparatus of claim 17 wherein:

said spring clip member has a plurality of slots disposed therein and configured to slidably receive and captively retain said outer end portions of said projections.

19. The electronic apparatus of claim 18 wherein:

said spring clip member has plate-like portions with laterally offset sections through which said slots extend.

20. The electronic apparatus of claim 19 wherein:

each of said slots has a first end portion, and a second end portion having a width greater than the width of said first end portion.

21. The electronic apparatus of claim 19 wherein:

said outer end portions of said retaining members have grooves therein, and said plurality of slots have opposing edge portions configured to be slidably received in said grooves.

* * * * *